(12) United States Patent
Heineman et al.

(10) Patent No.: US 8,847,682 B2
(45) Date of Patent: Sep. 30, 2014

(54) ATTENUATING NOISE AND CROSS-TALK IN AN AUDIO SYSTEM BY OFFSETTING OUTPUTS IN PHASE

(76) Inventors: Douglas E. Heineman, Lakeway, TX (US); Mark A. Alexander, Austin, TX (US)

( * ) Notice: Subject to any disclaimer, the term of this patent is extended or adjusted under 35 U.S.C. 154(b) by 0 days.

(21) Appl. No.: 13/595,276

(22) Filed: Aug. 27, 2012

(65) Prior Publication Data

US 2013/0088296 A1    Apr. 11, 2013

Related U.S. Application Data

(60) Provisional application No. 61/543,998, filed on Oct. 6, 2011.

(51) Int. Cl.
- *H03F 3/45* (2006.01)
- *H03F 1/26* (2006.01)
- *H03K 5/003* (2006.01)
- *H03F 3/217* (2006.01)
- *H03F 3/189* (2006.01)

(52) U.S. Cl.
CPC ............. *H03K 5/003* (2013.01); *H03F 3/45* (2013.01); *H03F 1/26* (2013.01); *H03F 3/2173* (2013.01); *H03F 3/189* (2013.01)
USPC ........................................ 330/251; 330/207 A

(58) Field of Classification Search
CPC .......................................................... H03F 3/217
USPC ........................................ 330/10, 207 A, 251
See application file for complete search history.

(56) References Cited

U.S. PATENT DOCUMENTS 7,262,658 B2 *    8/2007    Ramaswamy et al. ........ 330/251

* cited by examiner

*Primary Examiner* — Robert Pascal
*Assistant Examiner* — Khiem Nguyen
(74) *Attorney, Agent, or Firm* — Meyertons Hood Kivlin Kowert & Goetzel, P.C.; Jeffrey C. Hood

(57) ABSTRACT

An amplifier may include two or more pulse-width modulators (PWMs) controlling respective sets of switches to produce an amplified version of a source signal. The clocking for the amplifier may be controlled to delay signal processing within the PWMs relative to one another in time, thereby providing an effective time offset between the respective edge transitions of the controlling signals provided to the respective sets of switches. The PWMs may count down to zero from the next PWM duty-cycle value when a new data sample is detected, beginning a new count for each new sample, with the PWM outputting a pulse when the counter value is non-zero. A "data-sample-ready" signal may be decoded from a master counter, which may be clocked based on the high speed PWM clock, and the decode value may be adjusted to determine when the PWM should initialize to the next data sample.

20 Claims, 12 Drawing Sheets

ATTENUATING NOISE AND CROSS-TALK IN AN AUDIO SYSTEM BY OFFSETTING OUTPUTS IN PHASE

PRIORITY CLAIM

This application claims benefit of priority of U.S. provisional application Ser. No. 61/543,998 titled "Circuits and Methods Used in Audio Signal Processing", filed Oct. 6, 2011, which is hereby incorporated by reference in its entirety as though fully and completely set forth herein.

FIELD OF THE INVENTION

The present invention relates generally to signal processing, and more particularly to attenuating noise and cross-talk in an audio system.

DESCRIPTION OF THE RELATED ART

Signal processing represents a combined application of electrical/computer engineering and mathematical principles, primarily directed to the analysis of and operation on either discrete or continuous time signals. Signals of interest can include sound, images, time-varying measurement values and sensor data, for example biological data such as electrocardiograms, control system signals, telecommunication transmission signals such as radio signals, and many others. Signals are typically analog and/or digital electrical representations of time-varying or spatial-varying physical quantities. Types of signal processing include analog, discrete time, and digital.

Analog signal processing is performed on signals that have not been digitized, for example signals that are used in classical radio, telephone, radar, and television systems. Analog signal processing typically makes use of linear electronic circuits such as passive filters, active filters, additive mixers, integrators and various types of delay lines, as well as non-linear circuits such as frequency mixers and voltage-controlled amplifiers, voltage-controlled filters, voltage-controlled oscillators and phase-locked loops. Discrete time signal processing is performed on sampled signals that are defined at discrete points in time, and as such are quantized in time, but not in magnitude. Analog discrete-time signal processing is based on electronic devices such as sample and hold circuits, analog time-division multiplexers, analog delay lines and analog feedback shift registers, and may be considered a predecessor of digital signal processing.

Digital signal processing involves the processing of digitized discrete-time sampled signals. Processing is typically performed by general-purpose computers or digital circuits such as application specific integrated circuits (ASICs), field-programmable gate arrays, or specialized digital signal processors (DSPs). Digital signal processing mostly includes performing arithmetic operations such as fixed-point and floating-point operations, real-valued and complex-valued operations, multiplication and addition. Many of these operations are implemented through the use of circular buffers and look-up tables. Examples of digital signal processing algorithms include Fast Fourier transforms (FFT), finite impulse response (FIR) filters, infinite impulse response (IIR) filters, and adaptive filters such as the Wiener and Kalman filters.

Audio signal processing, sometimes referred to as audio processing, is the processing of electrical signals that correspond to auditory signals, or sound. Since audio signals may be electronically represented in either digital or analog format, audio signal processing may also take place in either the analog or digital domain. In analog audio signal processing, operations are performed directly on the electrical signals corresponding to the audio signals, while digital signal processing consists mostly of mathematical operations performed on digital representations of the electrical signals that correspond to respective audio signals. Typically, the digital representation of audio signals expresses the pressure waveform that characterizes the audio signal as a sequence of binary numbers. This permits signal processing using digital circuits such as microprocessors and computers, and while analog to digital conversion can be prone to loss, most modern audio systems use the digital approach because digital signal processing techniques are overall more powerful and efficient than signal processing in the analog domain.

Overall, since audio signals first need to be converted to electrical signals, digital audio processing systems include both analog and digital components in a full processing path that begins with the pressure waveforms that physically define the audio signal and ends with the digital representation of the corresponding electrical signals derived therefrom. Some of the most common components typically used in audio processing systems include pulse-width modulators, power limiters, start-up circuits, power regulators, comparators, amplifiers, oscillators, among others. The quality and operating precision of these components directly impacts the quality of audio signal processing systems, as designers have to continually overcome numerous difficult design challenges to meet required specifications and quality standards.

SUMMARY OF THE INVENTION

Various embodiments are presented of improved audio signal processing circuits, systems, and methods. In one set of embodiments, multiple channels of audio signals are driven through an open-loop, class-D amplifier with two or more pulse-width modulators (PWMs) controlling respective sets of switches to produce an amplified audio output. The sets of switches controlled by a single-ended amplifier may be in a half-bridge circuit configuration in which a set of two switches, that is, a high side switch and a low side switch are used in a push-pull (totem pole) configuration. In some embodiments, the amplifier may electrically drive an output power stage in a full bridge configuration in which two half-bridge circuits are connected to form an effective full bridge circuit. The electrical disturbance created in a full bridge circuit and its peripheral support circuitry (such as the gate drive circuit) when all the high side switches turn on within a short period of time with respect to each other may distort the output of the amplifier. The noise that is thereby created may be considered an additive non-linearity. Therefore, the qualitative performance of the amplifier may be susceptible to zero crossing distortion when the PWM outputs of the amplifier attempt to simultaneously turn on the high side switches. The zero crossing distortion causes a distinct and measurable rise in the noise floor of the amplifier because the edge alignments are corrupted in time. Therefore, it is desirable to create a timing offset between the signals controlling the high-side switches to prevent simultaneous or near simultaneous edge alignments.

If two or more full- or half-bridge circuits are relatively close in proximity, for example on the same silicon die, the noise from one bridge circuit may couple into the adjacent bridge circuit. The issue of crosstalk between channels distorting or introducing noise into the other channel is made worse when both channels of audio are driving the bridge circuits in or near a zero-crossing state. Therefore, the non-linear noise and the crosstalk between the output channels in single-ended and differential output amplifiers may be attenuated by offsetting the audio processing between the audio channels in the amplifier to delay the PWM output of each channel relative to the other channel. The delay between the channels allows the electrical perturbations in the leading bridge circuit to diminish to levels that do not corrupt the delayed signal in the lagging bridge circuit. The clocking scheme in the system may be controlled to delay the processing of the PWM signals in time relative to one another. This provides the necessary and effective time offset between the absolute moment in time of the edge transition of the control signals that are provided to the respective sets of switches (or bridge circuits) of the different channels. Therefore, by controlling the clocking to delay the processing of the PWM signals relative to one another in time, an effective offset is produced between the timing of the rising edges of the respective PWM signals output by the PWM drivers, and an effective offset is produced between the timing of the falling edges of the respective PWM signals output by the PWM drivers.

The PWM driver circuit may be implemented with a decrementor or a counter which decreases its next value relative to its last value at a specified clocked frequency. The counter may be operated to stop the counting at zero, and not resume counting until the next sample is present. The PWM output pulse from the audio amplifier may follow the value of the counter, that is, it may correspond to the counter output. Accordingly, the PWM output may be kept low—that is, no pulse may be output—when the counter value (or output) is zero. Conversely, the PWM output may be kept high—that is, a pulse may be output—when the counter value (or output) is non-zero. The counter may be loaded with a new value representative of the next PWM duty-cycle value calculated from the digital audio processor and the delta-sigma modulator. This new PWM duty-cycle value may be loaded into the decrementor at the start of an audio frame or anytime during the PWM output period once a new data sample (audio input) is detected. In some embodiments, a new "data sample ready" signal is decoded from a master counter, which is clocked based on (from) the high speed PWM clock, and the delay mechanism is based on adjusting the decode value to determine when the PWM circuit (driver) should initialize to the next data sample. The counter is designed to be deterministic, and operate continuously without disruption.

BRIEF DESCRIPTION OF THE DRAWINGS

A better understanding of embodiments of the present invention may be obtained when the following Detailed Description is considered in conjunction with the following drawings, in which.

Figure 1:
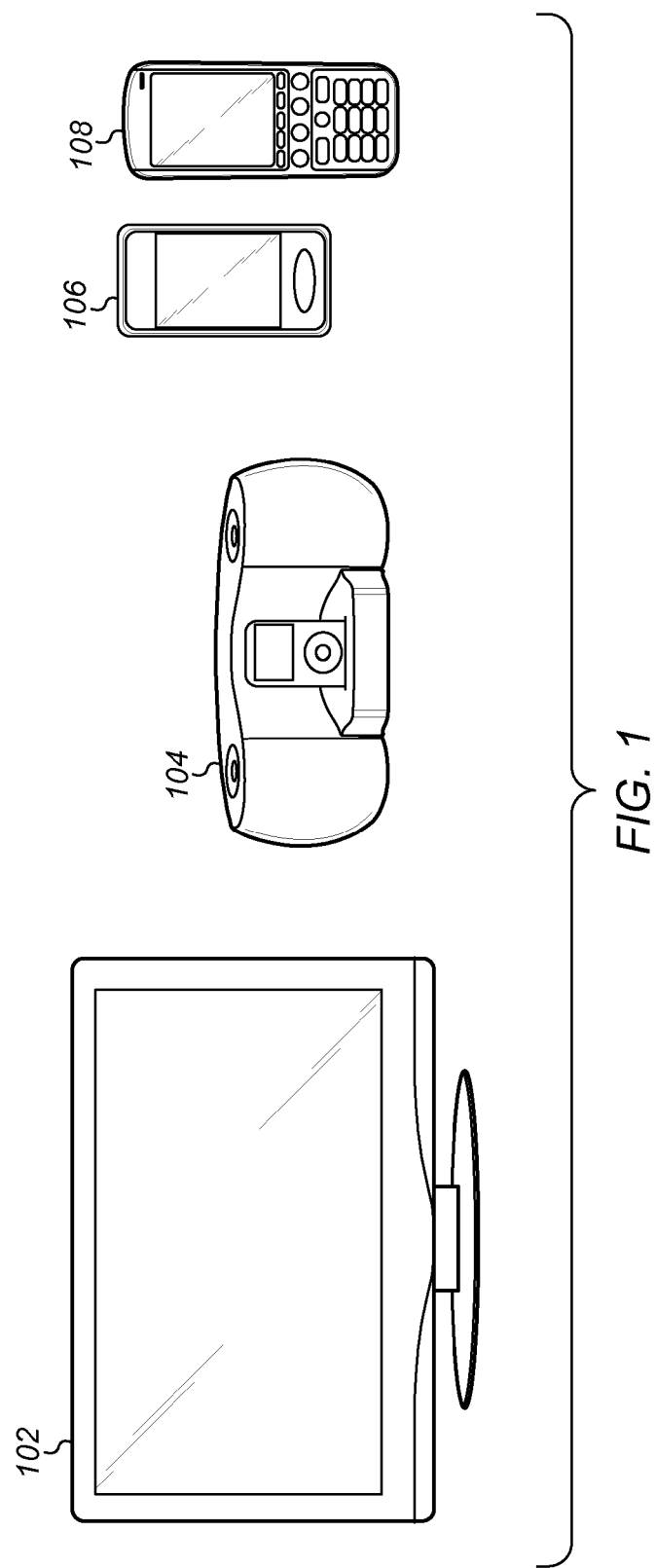
FIG. 1 illustrates various exemplary systems or devices which may use the techniques described herein.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

FIG. 1 illustrates exemplary systems, which may utilize the techniques described herein. More specifically, FIG. 1 illustrates exemplary systems, which may utilize an audio subsystem, (which may include an amplifier such as a Class D amplifier), featuring various improvements. As shown, embodiments of the techniques disclosed herein may be used in any one ore more of various systems which involve the amplification of signals. For example, embodiments of the invention may be used in various systems that operate to amplify audio signals for provision to a loudspeaker for audible presentation. As shown, the exemplary systems may include a display device 102; an audio system 104, such as a stereo amplified docking station for a portable music player, CD player, etc.; or a telephone 106 and 108, such as a smart phone, e.g., an iPHONE™ or other similar type of smart phone. It is noted that the various terms or designations for circuits as they appear herein, such as "driver", "delay", etc. are merely names or identifiers used to distinguish among the different circuits, and these terms are not intended to connote any specific meaning.

Figure 2:
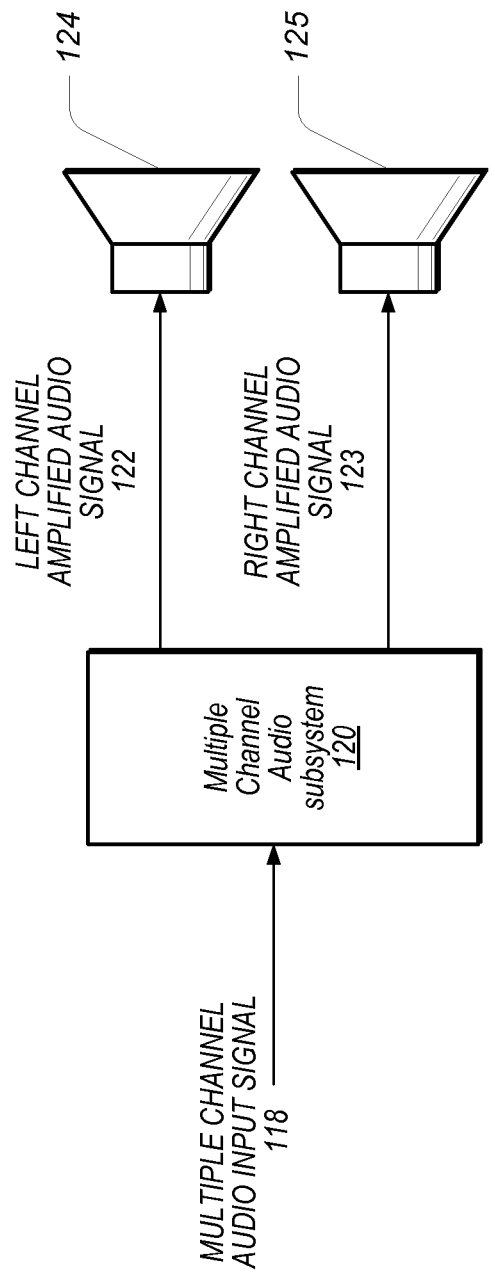
FIG. 2 is a block diagram of a portion of a system including a multi-channel audio subsystem that may be operated according to various embodiments.

FIG. 2 illustrates an Audio subsystem 120 which may be present in the systems of FIG. 1. In one set of embodiments, audio subsystem 120 may be an amplifier subsystem, which may more specifically be a class D amplifier subsystem. In one or more of the devices of FIG. 1, at least one Audio subsystem 120 may be present in the audio output section of the device, and more specifically in the amplifier portion of the audio section of the device. As shown in FIG. 2, a multiple channel (e.g. stereo) audio input signal 118 may be received at an input to the Audio subsystem 120. The Audio subsystem 120 receives the multiple channel audio input signal(s) 118 and operates to amplify the received audio input signal(s) to produce amplified multi-channels of audio output signals 122 and 123. The amplified audio output signals 122 and 123 may then be provided to loudspeakers 124 and 125, respectively, for audible presentation.

Figure 3:
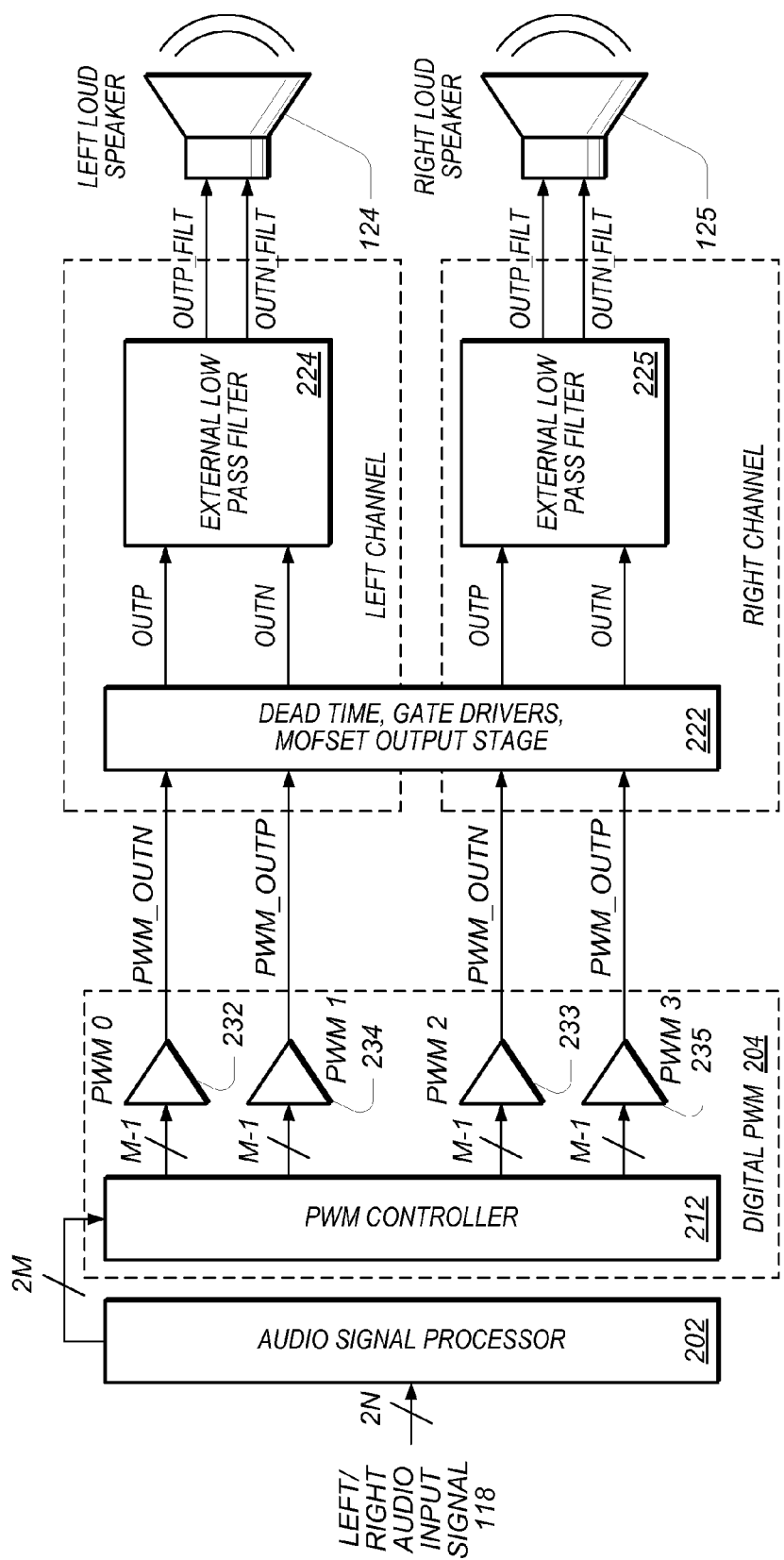
FIG. 3 is an exemplary block diagram of a multi-channel audio subsystem that may be operated according to various embodiments.

FIG. 3 is an exemplary block diagram of an audio subsystem (which, in some embodiments, may be one implementation of a Class D amplifier), according to one embodiment. As shown in FIG. 3, the audio subsystem comprises an input that receives stereophonic digital audio data commonly referred to as either left and right channels or A and B channels, which in this embodiment is an N-bit pulse code modulated (PCM) input signal. In one embodiment, the N bits of PCM digital audio data are received over an industry standard digital serial interface, such as the Integrated Interchip Sound bus, also referred to as the I²S bus, or they may also be received directly from a parallel port type interface. In an embodiment where the digital audio data is received from a Compact Disc (CD), the received digital audio data may comprise 16 bits of data. In this embodiment, the 16 bits are represented within the most significant bits of a data field that is 24 bits wide (that is, in this case N=24), along with 8 zeroes that are "padded" (or inserted) into the least significant bits.

The audio subsystem comprises a digital signal processor, referred to as Audio Signal Processor ASP 202. The ASP 202 may be implemented in any of various ways, such as by a programmable digital signal processor, a general-purpose processor, an FPGA (Field Programmable Gate Array), or a custom ASIC (Application Specific Integrated Circuit), or a combination of the above. The ASP 202 may receive the input signal and generate output data that is configured for use in generating respective pulse trains that corresponds to the input signal. The ASP 202 receives the N-bit input signal, which may be 24 bits in one embodiment (as described above), and generates a corresponding 2M-bit output, which may be an 18-bit output (which may also be considered as two 9-bit streams representative of two input channels of audio signal) in the embodiment mentioned above. The output of the ASP 202 is provided to a Digital PWM (Pulse Width Modulator) block 204.

The ASP 202 operates to reduce the number of bits to match the word length requirement of the pulse width modulators (PWMs), referred to as PWM0 and PWM1. The PWM block 204 could be designed to receive and use N (e.g. 24) bits. However, in some implementations, 24 bits would require block 204 to have a very high clock rate, i.e., a phase locked loop (PLL) would be required to drive the PWMs at very high frequencies. For example, PWMs designed to operate with up to 24 bits of resolution may require a clock frequency in the hundreds of Gigahertz range, which may be impractical from a circuit implementation perspective. In one set of preferred embodiments, the Digital PWM block 204 may operate with a frequency in the 200-400 MHz range, which may place an upper limit on the number of bits that the PWMs can receive. In the currently illustrated embodiment, the Digital PWM block 204 receives 2M bits (e.g. 2×9 bits), and uses a master clock frequency in the range of 200 MHz. In an embodiment where the block 204 receives 2×10 bits, the clock rate may double to approximately 400 MHz. In the currently preferred embodiment, the Digital PWM block 204 typically operates at a clock rate less than 500 MHz for reduced power supply consumption.

In stereophonic amplifiers, i.e. amplifiers with a left channel and a right channel, configured with differential outputs, the Digital PWM block 204 comprises a PWM Controller 212, four PWM blocks labeled PWM0 and PWM1 (for the left channel) and PWM2 and PWM3 (for the right channel), and may contain other logic as well. The PWM Controller 212 calculates edge locations of the pulse train to be generated, and produces four (M−1)-bit (in this case 8-bit) outputs. In particular, each of the four (M−1)-bit outputs may represent respective edges of pulses to be generated. The four (M−1)-bit-outputs are used by individual pulse width modulators PWM0 and PWM1, and PWM2 and PWM3 to produce the final differential PWM outputs. In general, PWM block 204 may comprise a small signal-processing block that operates on the 2M-bit input data and separates the 2M-bit input data into two pairs of individual streams of M−1 bits each. These (M−1)-bit streams may be independent. More specifically, the (M−1)-bit streams may have some correlation to each other, but the actual data may differ on an instantaneous pulse-by-pulse basis, even if the 2M-bit input to PWM block 204 is representative of very low frequency in-band AC waveforms or static DC values.

Block 222 may comprise logic for handling dead time, as well as a MOSFET Power Output Stage and gate drivers for controlling the MOSFET Power Output Stage previously described as a full-bridge circuit. The MOSFET Power Output Stage portion of block 222 comprises high power switches, preferably MOSFETs (Metal Oxide Semiconductor Field Effect Transistors). The high power switches generate a high-power (amplified) replica of the received pulse train. The MOSFET Power Output Stage portion provides the amplified pulse train to low pass filter 224. As shown, the Output Stage provides a differential pair of output signals, referred to as OUTP and OUTN, which provide two differential pulses per PWM period. The low pass filter 224 operates to remove unwanted out-of-band spectral components, and provides the two outputs, referred to as OUTP_FILT and OUTN_FILT, to a load, e.g., to a loudspeaker 124.

Figure 4:
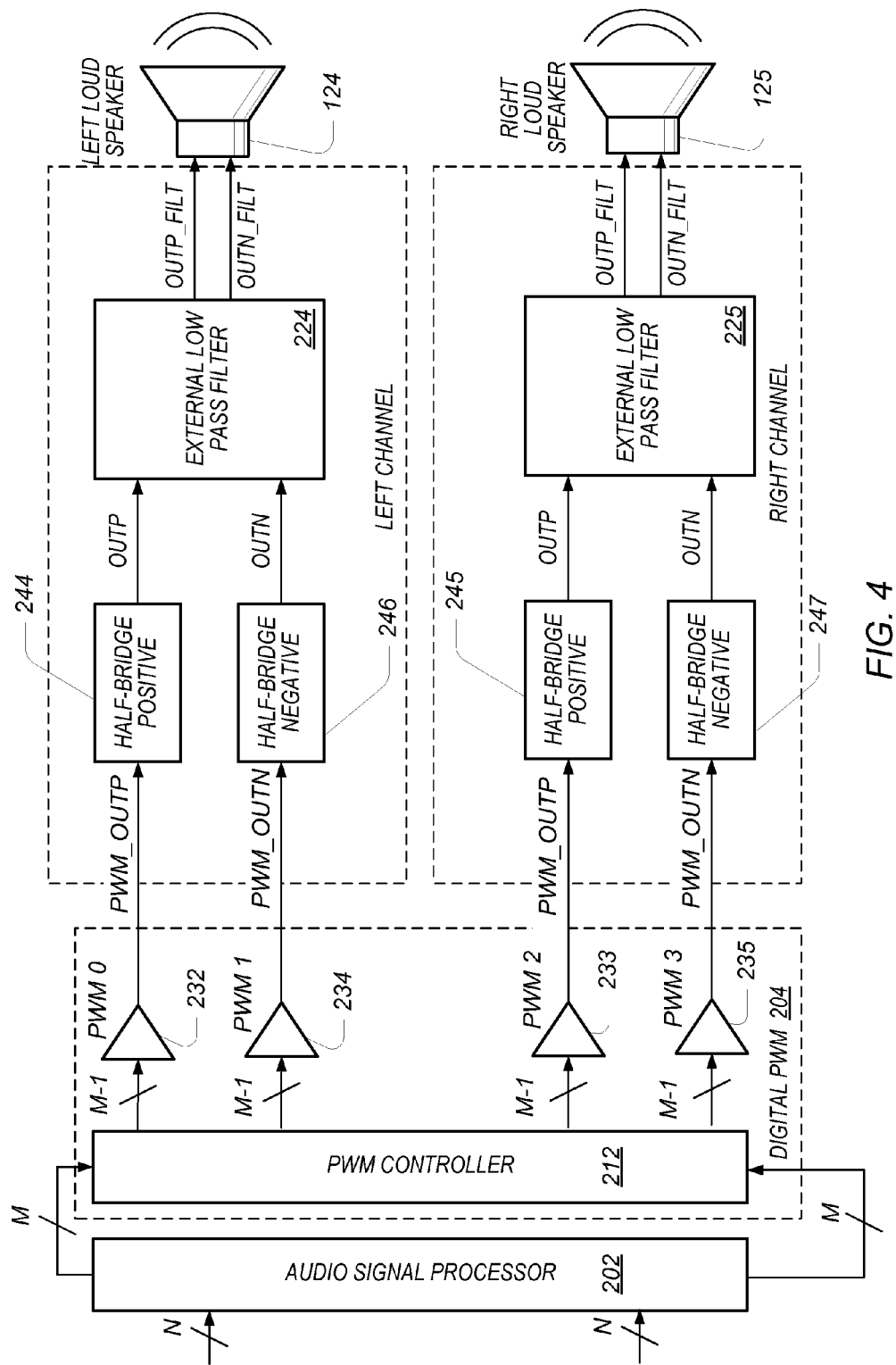
FIG. 4 shows the partial block diagram of a multi-channel audio system highlighting the role of pulse-width modulation (PWM) in the audio system.

FIG. 4 shows the partial block diagram of an audio system highlighting the role of the PWM in generating the output. The number of bits for audio signal processor 202 and PWM controller 212 are shown for illustrative purposes only, and alternate embodiments may include different numbers of bits. As shown in the audio subsystem in FIG. 4, a class-D type amplifier (one possible implementation of which is also shown in FIG. 3) is configured as a class-BD amplifier, where a stereo audio signal is pulse-width modified into two pairs of signals, with a positive representation PWM_OUTP and a negative representation PWM_OUTN in each pair, which are used to drive two respective half-bridge FET circuits 244 and 246, and 245 and 247. Each pair of half-bridge circuits, half-bridge positive 244 and half-bridge negative 246, and half-bridge positive 245 and half-bridge negative 247 may be connected to form respective effective full-bridge circuits to the respective loads (in this case speakers 124 and 125, respectively) where the half-bridge circuits use a set of switches in a totem pole (make-and-break) configuration.

Figure 5:
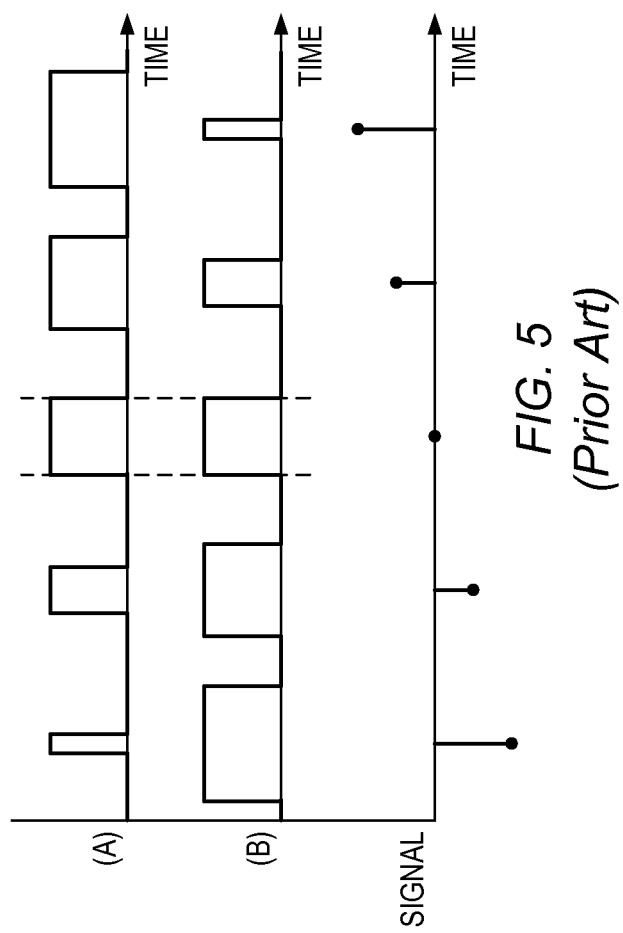
FIG. 5 provides an exemplary waveform representation of the aligning of respective rising and falling edges of a pair of PWM signals from a respective pair of half-bridge circuits, at the zero signal source level.

FIG. 5 provides an exemplary waveform representation of the respective rising and falling edges of the PWM signals from a half-bridge A and a half-bridge B, as the respective edges align with respect to each other at the zero signal source level. For example, signal A might represent the output of half-bridge 244, and signal B might represent the output of half-bridge 246. The potential adverse effects of this edge alignment are discussed in further detail below.

The PWM drivers (output signals OUTP and OUTN) may cause unwanted noise coupling into each half-bridge near zero-crossings, and low signal levels (mute and near digital silence). The issue of noise coupling near low signal levels can be caused by non-linearities in the power stage, where a power stage is a set of circuits partially composed of pre-drivers, gate drivers and the half-bridge circuits. This noise coupling is further exasperated when the high-side FET in four half-bridge circuits as shown in FIG. 4 are turned on at a near simultaneous event which may occur when stereophonic channels are both near zero input levels. The audio signal processor 202, PWM controller 212, and one pair of PWM circuits from FIG. 4 may also be represented as shown in the system block diagram of FIG. 6, where the audio input signal is detected at I²S interface 702, goes through digital audio processor and interpolator 704, and processed in PWM pre-processor 706 prior to being converted into pulse-width modulated signals PWM_OUTP and PWM_OUTN through PWM drivers 710 and 712, respectively.

Figure 6:
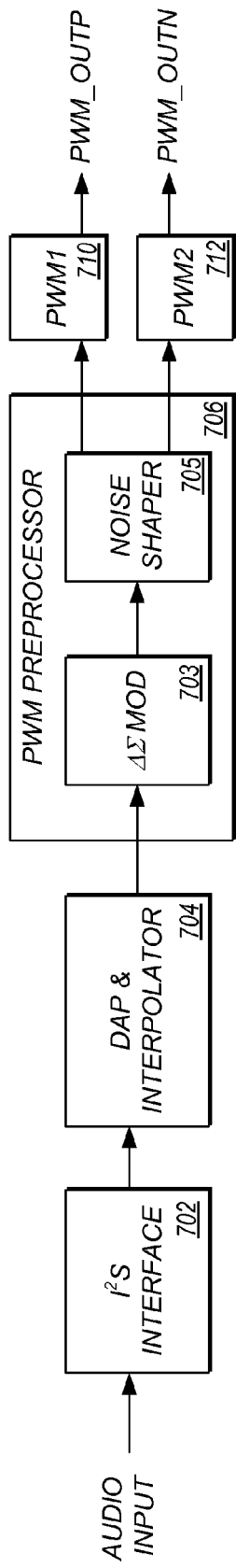
FIG. 6 shows a more detailed partial block diagram of one prior art implementation of the audio signal processor, PWM controller and PWM circuits of FIG. 4.
Figure 7:
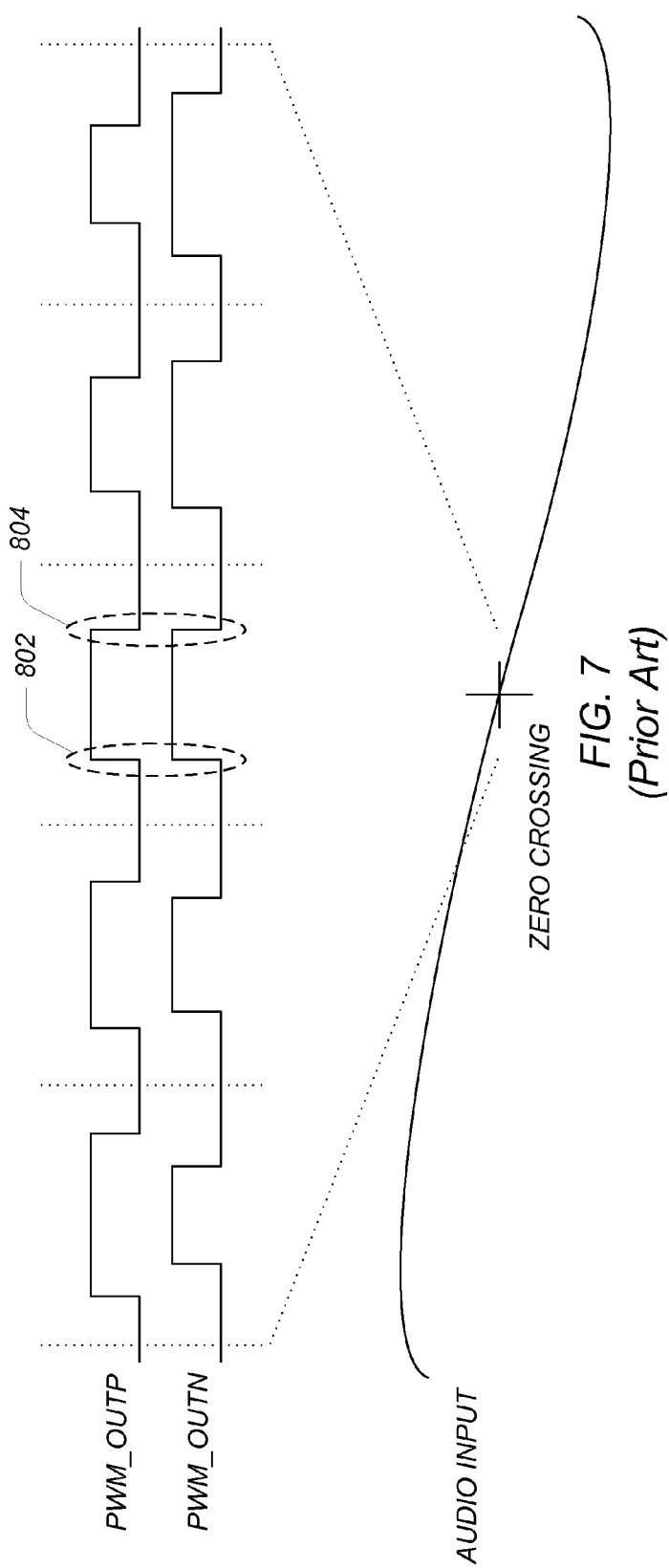
FIG. 7 shows a waveform diagram illustrating the PWM signals PWM_OUTP and PWM_OUTN, and the audio signal near the zero crossing, for the implementation of FIG. 6.

In the embodiment shown in FIG. 6, PWM preprocessor 706 includes a delta-sigma modulator 703 and noise shaper 705 used to provide respective digital signals based on the original audio signal to PWM drivers 710 and 712. FIG. 7 shows a waveform diagram illustrating the PWM signals PWM_OUTP and PWM_OUTN, and the original audio input signal near the zero crossing. As shown in FIG. 7 (and similar to FIG. 5), the audio input signal of a bipolar representation (positive and negative amplitude) nears a point where the audio signal crosses zero. At this cross-section, the edges of the PWM signals PWM_OUTP and PWM_OUTN are near coincident, as also shown in FIG. 7 with rising edges 802 and falling edges 804 of the PWM_OUTP and PWM_OUTN signals, respectively. This close proximity of rising edges may cause corruption on the lagging edge within the power stage. This corruption occurs as the power stage exhibits the greatest amount of noise when the HS FET is turned on. If the lagging PWM signal is presently provided to the gate drive circuitry, its level may be corrupted by the noise from turning on the HS FET of the leading PWM signal.

Attenuating Cross-Talk in an Audio System by Offsetting Outputs in Phase

As previously mentioned, the signal-to-noise degradation in a multi-channel digital audio system may be reduced by reducing the crosstalk between the channels. In audio systems, the timing of the edges of the PWM data streams in the half-bridge or full-bridge power stages can influence noise in other channels through ground bounce or power supply sag. However, cross-channel noise may be reduced by offsetting the edges of the output channels in time. In many present day systems, this problem is addressed by adding delay to one of the channel outputs, through the use of delay cells, for example. However, these delay cells do not sustain uniform timing delays with respect to process variations in the manufacturing, and with respect to temperature fluctuations. The variations in delay cause functional differences in the noise reduction for those systems. Other solutions seek to alter the PWM audio data content by adding or subtracting codes to offset the timing between the channels. However, adding or subtracting an offset to/from the PWM data can possibly alter the audio signal if the new audio signal results in clipping. Furthermore, the hardware associated with introducing adders and saturation checks is undesirable.

Figure 8:
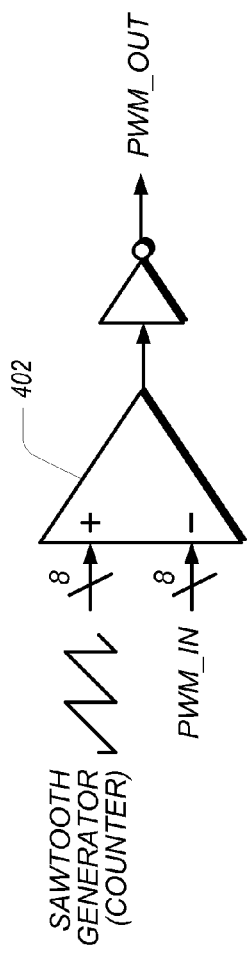
FIG. 8 shows one example of a simplified typical prior art digital PWM equivalent circuit.

One example of a simplified typical prior art digital PWM equivalent circuit is shown in FIG. 8. The PWM generator shown in FIG. 8 generates a pulse train whose width is proportional to the input signal PWM_IN. A sawtooth waveform, which may be generated using a counter, is provided to one set of inputs of a comparator 402. In the example of FIG. 8, the inputs are 8-bit signals. When the value of the input PWM_IN is less than the value of the sawtooth wave, the output PWM_OUT is low (i.e. there is no pulse output). When the value of the input PWM_IN is greater than the value of the sawtooth wave, the output PWM_OUT high (i.e. a pulse is output by the output staying high until the value of the input PWM_IN is again less than the value of the sawtooth wave). The PWM circuit (driver) shown in FIG. 8 may be one implementation of PWM drivers 232, 233, 234, and 235 shown in FIG. 3, to generate any of the output signals PWM_OUTN and PWM_OUTP.

Figure 9:
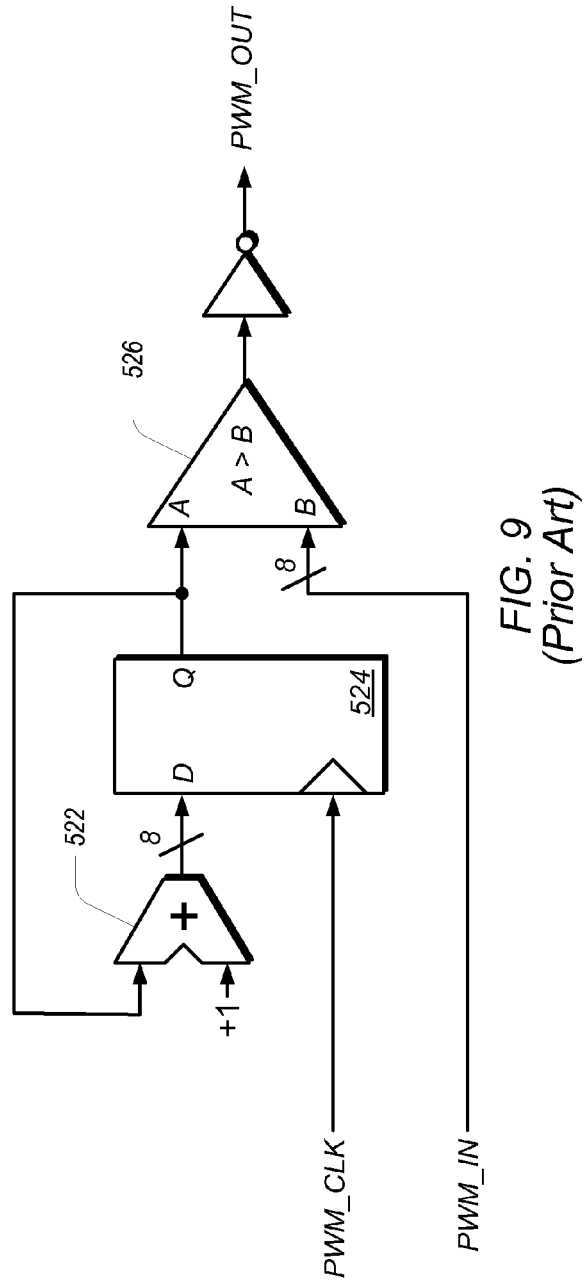
FIG. 9 shows one possible digital implementation of the simplified typical prior art digital PWM equivalent circuit of FIG. 8.

FIG. 9 shows one possible digital implementation of the simplified typical prior art digital PWM equivalent circuit of FIG. 8. Again, the circuit shown in FIG. 9 may be one implementation for PWM drivers 232, 233, 234, and 235, one instance being used for generating PWM_OUTN, and the other instance used for generating PWM_OUTP. In this implementation, the data input into a latch 524 is the output of arithmetic logic unit (ALU) 522, which increments the present value output by latch 524. Latch 524 is clocked with a PMW_CLK clock signal to thereby generate an input representative of a sawtooth waveform, which has a value of zero every $256^{th}$ cycle of PWM_CLK. Comparator 526 compares the present value of the sawtooth waveform with the present value of the PWM_IN signal to generate the PWM output waveform PWM_OUT. The PWM output waveform (signal) PWM_OUT will be asserted (i.e. have a 'high' value) when the value of PWM_IN is greater than or equal to the value of the output of latch 524. Conversely, PWM_OUT will be deasserted (i.e. have a 'low' value) when the value of PWM_IN is lower than the value of the output of latch 504.

Figure 10:
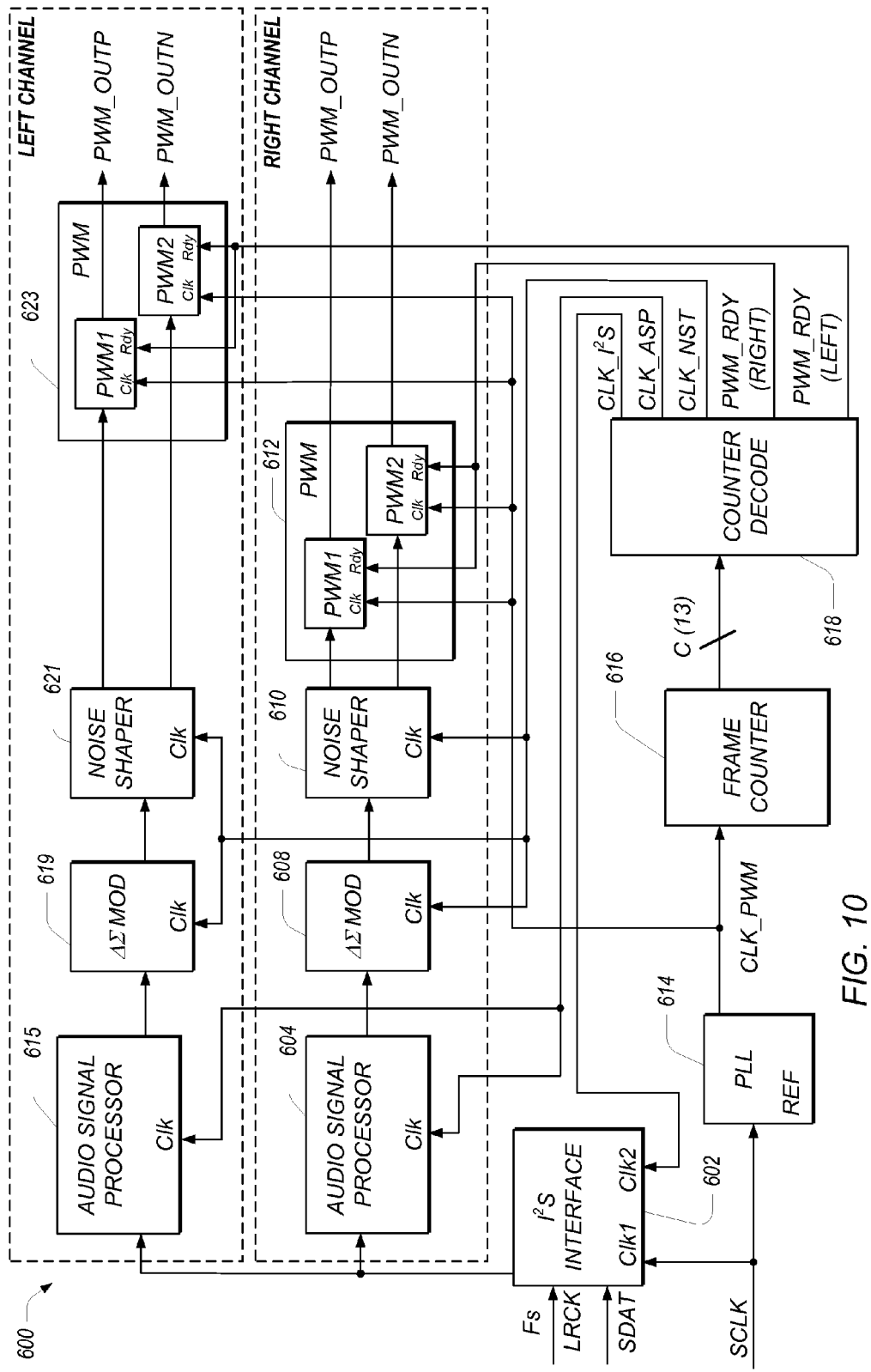
FIG. 10 shows the partial block diagram of an audio subsystem, in which a high frequency counter and decode circuit is used to derive the clock signals for a Digital Audio Processor and PWM pre-processor circuits.

A novel digital PWM circuit may operate to delay the processing of the PWM output pulses in time. In one set of embodiments, an audio system may first process the audio data in a Digital Audio Processor, or Audio Signal Processor (ASP) and a PWM pre-processor (which may include a Delta-Sigma modulator and noise shaper) at a slower clock rate than the clock rate at which the signal is processed in the PWM generator. Therefore, the PWM generator may latch its input data at any time during the PWM period. FIG. 10 shows the partial block diagram of a stereophonic audio subsystem 600, which receives a serial data stream SDAT at an I²S interface and generates corresponding respective PWM outputs per stereo channels. With reference to the audio subsystem shown in FIG. 3, functional blocks 602, 604-610, and 615-621 in audio subsystem 600 may be considered parts of audio signal processor 202 for both the right channel and left channel, respectively, and PWM blocks 612 and 623 may be considered part of digital PWM block 204, again for both the right channel and left channel, respectively. The remaining components may be considered part of both audio signal processor 202 and digital PWM block 204, as they operate on the system level to delay the processing of the PWM_OUTP signals in time relative to PWM_OUTN signals, and vice-versa. Thus, audio subsystem 600 may be implemented in audio signal processor 202 and digital PWM block 204 for each output signal, one instance each for PWM_OUTP and PWM_OUTN for each channel, as shown.

In audio subsystem 600, a high frequency counter 616 and decode circuit 618 are used to derive the clock signals used in the system. Clock signals CLK_I²S and CLK_ASP are used for block synchronization for signal data transfer and audio frame alignment for ASPs 604 and 615, and clock signal CLK_NST is used to clock the PWM pre-processor circuits, which include Delta-Sigma modulators 608 and 619, and noise shapers 610 and 621. The clock signals may be derived from a phase-locked loop (PLL) 614 that receives a reference clock signal SCLK. The same high-speed counter 616 and decode circuit 618 is used to generate channel specific data-ready signals PWM_RDY (LEFT) and PWM_RDY (RIGHT), which are used respectively by the PWM generators 623 and 612 to latch their respective input data. Therefore, by using the decode circuit 618 to derive respective data ready signals that are both later in time, audio subsystem 600 may delay the processing of the signals within the PWM generator (circuits) 612 and 623 from channel to channel, and therefore offset, in time, the channel signal outputs (PWM_OUTP and PWM_OUTN) of one channel relative to the channel signal outputs of the other channel.

Figure 11:
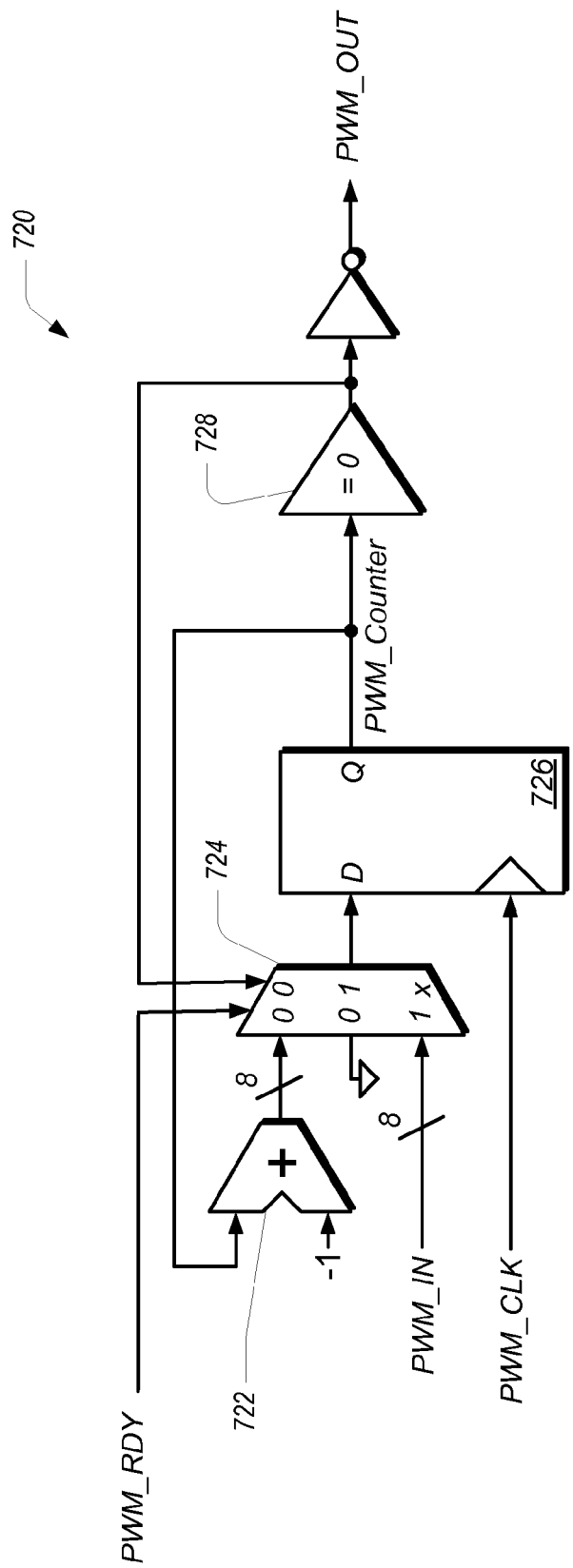
FIG. 11 shows one embodiment of a digital PWM circuit implemented with a decrementor.

Any of the generator sub-blocks PWM1 and PWM2 within PWM generator blocks 612 and 623 in audio subsystem 600 of FIG. 10 may be implemented as shown in FIG. 11, which shows one embodiment of a digital PWM circuit 720 implemented with a decrementor constructed using an ALU 722, multiplexer 724, and latch 726. The decrementor starts to count down from the value of PWM_IN when a new data sample (audio input) is detected. PWM_RDY is the signal indicating a new sample has been detected, and is provided as one of the select signals to multiplexer 724. The other select signal is the output of comparator 728, which is asserted when the output of latch 726 is (reaches) zero (0), and deasserted otherwise, i.e. when the output of latch 726 is nonzero. The combination of PWM_RDY with the output of comparator 728 is used to select the value provided as the input to latch 726. When PWM_RDY is deasserted—indicating that no new data sample has been detected, and the output of comparator 728 is asserted—indicating that the output latch 726 is zero, a default value of zero (0) is selected in multiplexer 724 to be provided to latch 726. Thus, the output PWM_OUT remains zero at least until a new data sample is detected, once the output of latch 726 reaches zero.

When a new data sample is detected, PWM_RDY is asserted for one cycle of the clock signal PWM_CLK, which results in the present value PWM_IN being selected in multiplexer 724, thereby providing the value PWM_IN to latch 726. Since the output of latch 726 is fed back to one of the inputs of ALU 722, the count start value becomes PWM_IN. In addition, since the output of latch 726 at this point is no longer zero, the output of comparator 728 becomes deasserted, and the output of ALU 722 is selected in multiplexer 724, which results in the output of ALU 722 being provided as the input into latch 726. ALU 722 is set up to decrement by 1 the value received at its top terminal, resulting in its output decreasing by 1 each subsequent cycle of clock signal PWM_CLK, until the output of ALU 722 reaches 0. Once a 0 (zero) input is provided to latch 726, and is clocked to the output of latch 726, the output of comparator 728 is asserted, resulting in a 0 value being selected in multiplexer 724, provided that PWM_RDY is deasserted. The counter therefore stops counting at zero until the next sample is present. The output of the circuit shown in FIG. 11 is therefore a pulse that is low when the counter is zero and high when the counter is non-zero, as a result of the output of comparator 728 being inverted.

Figure 12:
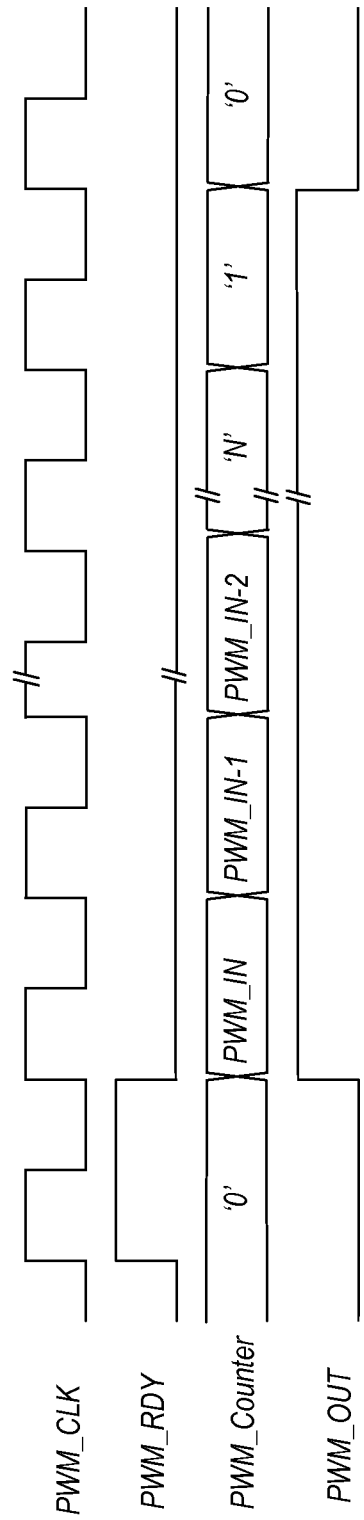
FIG. 12 shows a timing diagram of the input and output signals corresponding to the digital PWM circuit of FIG. 11.

FIG. 12 shows a timing diagram of the input signals and output signals of circuit 720 of FIG. 11 to highlight operation of circuit 720. The signal "PWM_Counter" shown in FIG. 12 corresponds to the output of latch 726. As seen in FIG. 12, when the PWM_RDY signal is deasserted, and the PWM_Counter signal, output of latch 726, is also equal to zero (resulting in the output of comparator 728 being asserted), the PWM output is also zero. When a new data sample is detected, the PWM_RDY is asserted for one cycle of the clock signal PWM_CLK, resulting in the output of latch 726 being set to the value PWM_IN on the next clock edge. Subsequently, the count output is decremented by 1 each clock cycle of PWM_CLK until the count value reaches 0. During this time period, the PWM output is asserted, producing a pulse width that corresponds to the value of PWM_IN, deasserted once the count reaches 0, and remaining at the value of 0 until a new sample is detected and the PWM_RDY signal is once again asserted.

Figure 13:
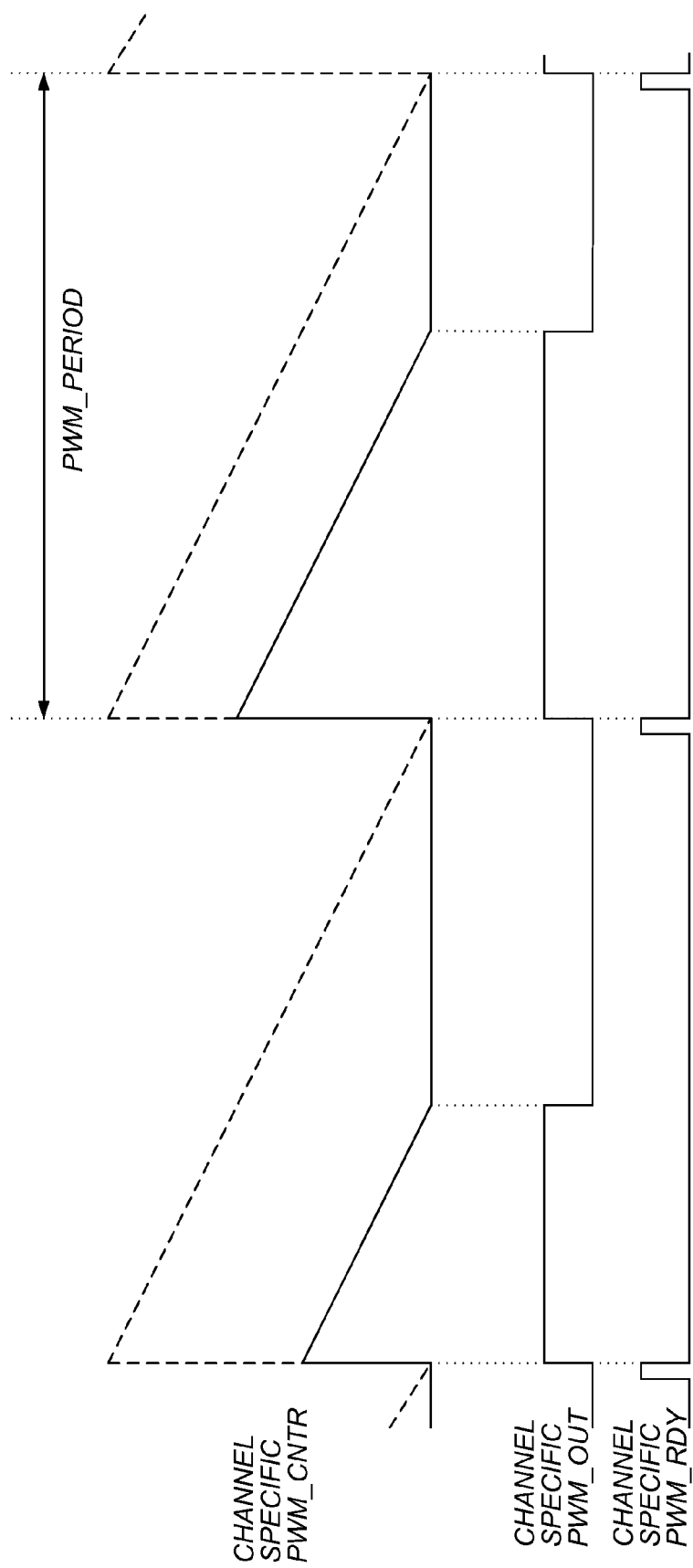
FIG. 13 shows a waveform diagram illustrating a generic channel PWM output at 0° offset for an audio subsystem built according to the embodiments of FIG. 10 and FIG. 11.

FIG. 13 shows a waveform diagram illustrating the PWM output at zero degree (0°) offset synchronous to an audio frame within a PWM PERIOD in a system such as audio subsystem 600 of FIG. 10, using the implementation of PWM driver 720 shown in FIG. 11 to generate the PWM output signals. When considering the audio subsystem 600 shown in FIG. 10, the signal diagram in FIG. 13 may correspond to each output from PWM blocks 612 and 623, assuming that each PWM block had different PWM_IN signals to reconstruct audio signals for the right and left stereo channels, driving differential outputs, PWM_OUTP and PWM_OUTN.

Figure 14:
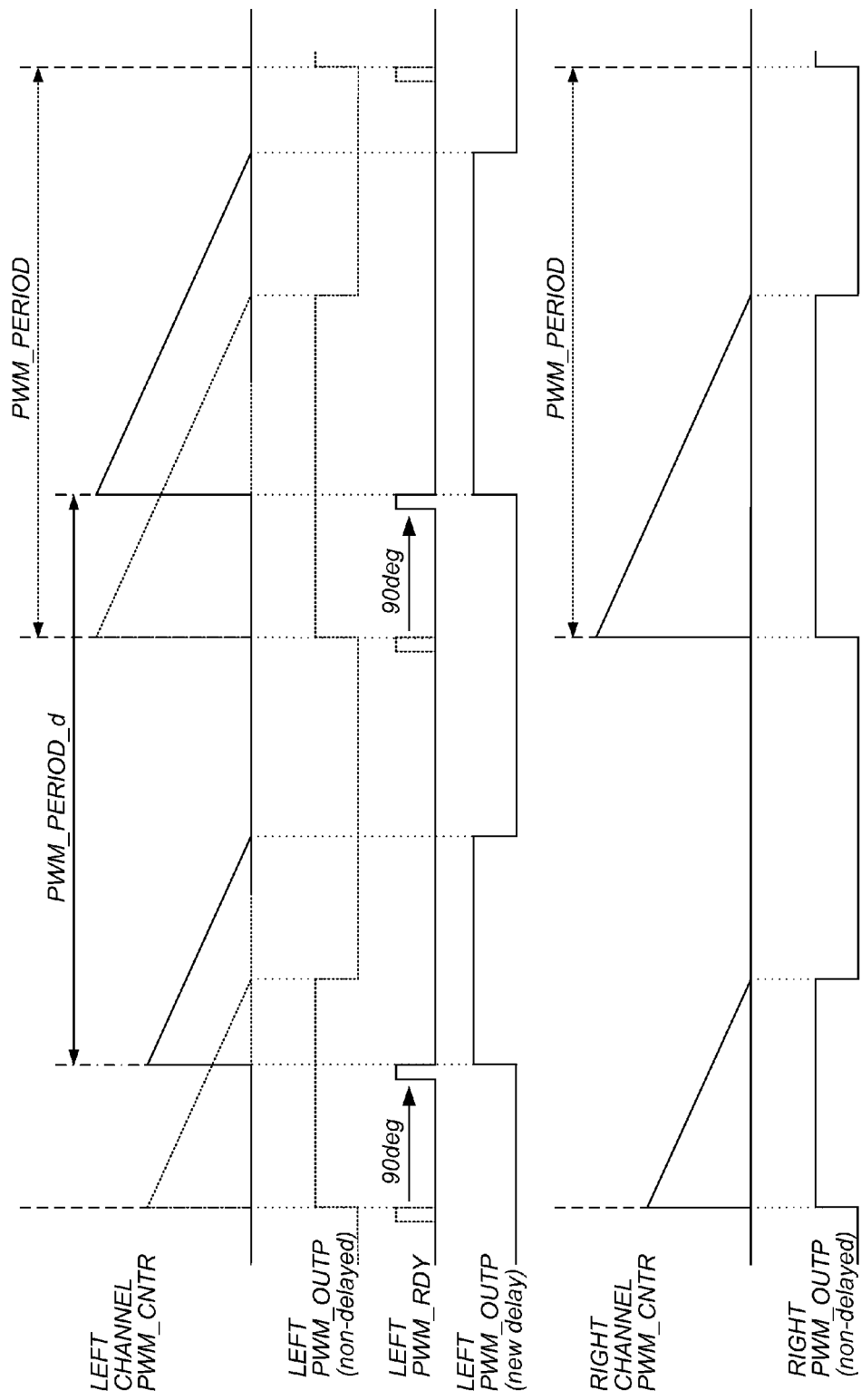
FIG. 14 shows a waveform diagram illustrating the left channel PWM outputs at 90° offset relative to the right channel PWM outputs for a multi-channel audio subsystem built according to the embodiments of FIG. 10 and FIG. 11.

FIG. 14 shows a waveform diagram illustrating an example where the left channel differential PWM outputs (showing only the PWM_OUTP signal) have been delayed by 90 degree (90°) offset with respect to the right channel differential PWM outputs (again, showing only the PWM_OUTP signal) within the PWM_PERIOD for the same system setup as the waveforms in FIG. 13. Delaying the data ready signal PWM_RDY to the PWM driver (e.g. PWM driver 612) by decoding the counter 90-degrees offset in time may generate the signals shown in FIG. 14, where the signals explicitly labeled "new delay" denote the new signals relative to the right channel PWM output which is not delayed and set to the default 0° offset. The delayed PWM period is indicated as "PWM_PERIOD_d".

Although the embodiments above have been described in considerable detail, numerous variations and modifications will become apparent to those skilled in the art once the above disclosure is fully appreciated. It is intended that the following claims be interpreted to embrace all such variations and modifications.

We claim:
1. A method for attenuating non-linear noise in an open-loop amplifier, the method comprising:
  receiving a source signal;
  generating a first control input signal and a second control input signal from the source signal, wherein the first control input signal and the second control input signal are together representative of the source signal;
  generating a first control output signal by processing the first control input signal, and generating a second control output signal by processing the second control input signal;
  providing an effective timing offset between respective edge transitions of the first control output signal and the second control output signal by delaying in time said processing the first control input signal relative to said processing the second control input signal; and
  generating an amplified version of the source signal by:
    controlling a first set of switches with the first control output signal; and
    controlling a second set of switches with the second control output signal,
  wherein said delaying comprises:
    generating a first ready signal based on a frame counter clocked with a first clock signal also used for processing the first control input signal; and
    generating a second ready signal based on a frame counter clocked with a second clock signal also used for processing the second control input signal;

wherein the first control signal is not processed until the first ready signal is asserted, and wherein the second control signal is not processed until the second ready signal is asserted.

2. The method of claim 1, further comprising:
when asserting the first ready signal, asserting the first ready signal for a single cycle of a clock signal used for processing the first control input signal; and
when asserting the second ready signal, asserting the second ready signal for a single cycle of a clock signal used for processing the second control input signal.

3. The method of claim 1, wherein said generating the first ready signal comprises adjusting a first decode value derived from the frame counter to determine when to assert the first ready signal; and
wherein said generating the second ready signal comprises adjusting a second decode value derived from the frame counter to determine when to assert the second ready signal.

4. The method of claim 1;
wherein said processing the first control input signal comprises:
counting down from a present value of the first control input signal; and
asserting the first control output signal until said counting reaches zero; and
wherein said processing the second control input signal comprises:
counting down from a present value of the second control input signal; and
asserting the second control output signal until said counting reaches zero.

5. An amplifier comprising:
an input interface configured to receive a source signal;
a first set of control switches and a second set of control switches configured to produce an amplified version of the source signal;
a preprocessor configured to generate a first control input value and a second control input value based on the source signal, wherein the first control input value and the second control input value are together representative of a sample of the source signal;
driver circuitry configured to:
generate a first control output signal by processing the first control input value;
generate a second control output signal by processing the second control input value; and
create the amplified version of the source signal by controlling a first set of switches with the first control output signal, and controlling a second set of switches with the second control output signal; and
delay circuitry configured to provide an effective timing offset between respective edge transitions of the first control output signal and the second control output signal by instructing the driver circuitry to delay in time the processing of the first control input value relative to the processing of the second control input value;
wherein the delay circuitry is configured to generate a first ready signal and a second ready signal, and provide the first ready signal and the second ready signal to the driver circuitry; and
wherein the driver circuitry is configured to not process the first control input value until the first ready signal is asserted by the delay circuitry, and not process the second control input value until the second ready signal is asserted by the delay circuitry;

wherein the driver circuitry is configured to process the first control input value and the second control input value according to a first clock signal;
wherein the delay circuitry comprises:
a frame counter clocked with the first clock signal; and
a counter decode circuit configured to receive a count value from the frame counter and generate the first ready signal and the second ready signal according to the count value.

6. The amplifier of claim 5, wherein the driver circuitry is configured to process the first control input value and the second control input value according to a first clock signal;
wherein the delay circuitry is configured to assert the first ready signal and the second ready signal for a single cycle of the first clock signal.

7. The amplifier of claim 5, wherein the counter decode circuit is configured to derive a decode value from the count value, and adjust the decode value to specify when to assert the first ready signal and the second ready signal.

8. The amplifier of claim 5, wherein the driver circuitry comprises two stages respectively configured to:
receive the first input control value and the second input control value as respective input values;
receive the first ready signal and the second ready signal as respective count enable signals; and
generate the first control output signal and the second control output signal as respective outputs;
wherein each of the two stages is configured to:
begin counting down from the input control value to zero when the count enable signal is asserted;
assert the output until zero is reached; and
deassert the output once zero is reaches.

9. The amplifier of claim 5, wherein the driver circuitry comprises pulse-width modulation (PWM) circuitry, wherein the first control input value and the second control input value correspond to duty-cycle values, and the first control output signal and the second control output signal are PWM signals.

10. The amplifier of claim 5, further comprising the first set of switches and the second set of switches.

11. The amplifier of claim 10, wherein the first set of switches and the second set of switches comprise CMOS (Complementary Metal-Oxide Semiconductor) devices.

12. The amplifier of claim 5, wherein the source signal is an audio signal.

13. An amplifier comprising:
a first processing element configured to generate a first control value and a second control value from a sampled value of a source signal;
a second processing element configured to:
generate a first control output signal by processing the first control value;
generate a second control output signal by processing the second control value; and
create an amplified version of the source signal by controlling a first set of switches with the first control output signal, and controlling a second set of switches with the second control output signal; and
a third processing element configured to provide an effective timing offset between respective edge transitions of the first control output signal and the second control output signal by instructing the second processing element to delay in time the processing of the first control value relative to the processing of the second control value;
wherein the third processing element is configured to generate a first ready signal and a second ready signal; and wherein the second processing element is configured to not process the first control value until the first ready signal is asserted, and not process the second control value until the second ready signal is asserted;

wherein the second processing element is configured to process the first control value and the second control value according to a first clock signal;

wherein the third processing element comprises:
 a frame counter clocked with the first clock signal; and
 a counter decode circuit configured to receive a count value from the frame counter and generate the first ready signal and the second ready signal according to the count value.

14. The amplifier of claim 13, wherein the second processing element is configured to process the first control value and the second control value according to a first clock signal;

wherein the third processing element is configured to assert the first ready signal and the second ready signal for a single cycle of the first clock signal.

15. The amplifier of claim 13, wherein the counter decode circuit is configured to derive a decode value from the count value, and adjust the decode value to determine a first point in time at which to assert the first ready signal, and a second point in time at which to assert the second ready signal.

16. The amplifier of claim 13, wherein the second processing element is further configured to:
 begin a first count from the first control value to zero when the first ready signal is asserted;
 begin a second count from the second control value to zero when the second ready signal is asserted;
 assert the first control output signal until the first count reaches zero;
 assert the second control output signal until the second count reaches zero;
 deassert the first control output signal once the first count reaches zero; and
 deassert the second control output signal once the second count reaches zero.

17. The amplifier of claim 13, wherein the second processing element comprises:
 a first pulse-width modulation (PWM) circuit configured to receive the first control value which corresponds to a first duty-cycle value, and generate the first control output signal which is a PWM signal according to the first duty-cycle value; and
 a second PWM circuit configured to receive the second control value which corresponds to a second duty-cycle value, and generate the second control output signal which is a PWM signal according to the second duty-cycle value.

18. The amplifier of claim 13, further comprising the first set of switches and the second set of switches.

19. The amplifier of claim 18, wherein the first set of switches and the second set of switches comprise CMOS (Complementary Metal-Oxide Semiconductor) devices.

20. The amplifier of claim 13, wherein the source signal is an audio signal.

* * * * *